United States Patent [19]

Lee et al.

[11] Patent Number: 4,952,524

[45] Date of Patent: Aug. 28, 1990

[54] SEMICONDUCTOR DEVICE MANUFACTURE INCLUDING TRENCH FORMATION

[75] Inventors: Kuo-Hua Lee; Chih-Yuan Lu, both of Lehigh County, Pa.

[73] Assignee: AT&T Bell Laboratories, Murray Hill, N.J.

[21] Appl. No.: 347,975

[22] Filed: May 5, 1989

[51] Int. Cl.$^5$ .................................................. H01L 21/76
[52] U.S. Cl. ........................................ 437/67; 437/240; 437/982
[58] Field of Search ................ 437/67, 240, 982; 148/DIG. 133

[56] References Cited

U.S. PATENT DOCUMENTS

| 4,506,435 | 3/1985 | Pliskin et al. | 437/67 |
| 4,543,706 | 10/1985 | Bencuya et al. | 437/67 |
| 4,571,819 | 2/1986 | Rogers et al. | 156/653 |

FOREIGN PATENT DOCUMENTS

| 1196428 | 11/1985 | Canada | 437/67 |
| 0232748 | 8/1987 | European Pat. Off. | 437/67 |
| 57-12533 | 1/1982 | Japan | 437/67 |
| 58-143548 | 8/1983 | Japan | 437/67 |
| 59-63739 | 4/1984 | Japan | 437/67 |
| 59-106133 | 6/1984 | Japan | 437/67 |
| 60-43843 | 3/1985 | Japan | 437/67 |
| 61-8944 | 1/1986 | Japan | 437/67 |
| 61-90442 | 5/1986 | Japan | 437/67 |
| 62-216261 | 9/1987 | Japan | 437/67 |

Primary Examiner—Olik Chaudhuri
Attorney, Agent, or Firm—John T. Rehberg

[57] ABSTRACT

A trench which provides electrical isolation between transistors on an integrated circuit substrate is described. The trench is lined with a diffusion barrier, typically a thermal oxide followed by a thermal stress relief layer, typically formed from TEOS. Then a filler material, typically BPTEOS, is deposited to fill the trench and cover the upper surface of the wafer. The filler material is heated to make it flow. Next the outer surface of the flowed filler material is next subjected to an etch-back which makes the top surface of the filled trench protrude slightly above the upper surface of the substrate. The resulting trench contains the diffusion barrier layer, the thermal stress relief layer, and the filler material. The filler material and the thermal stress relief layer will soften during subsequent heat treatments of the wafer, thus relieving thermal stresses, and preventing the occurrence of defects and dislocations within the wafer.

13 Claims, 3 Drawing Sheets

SEMICONDUCTOR DEVICE MANUFACTURE INCLUDING TRENCH FORMATION

BACKGROUND OF THE INVENTION

1. Field of the Invention

This invention relates to semiconductor integrated circuits and more particularly to integrated circuits with trenches for inter-device isolation.

2. Description of the Prior Art

As integrated circuits become smaller, the need for effective isolation between individual devices becomes more critical. Structures used for inter-device isolation should desirably provide effective electrical isolation while occupying little space and allowing good surface planarity.

One method of inter-device isolation is the use of a field oxide between devices. Field oxides provide acceptable isolation between devices with shallow active regions. However, field oxides grown by conventional processes often exhibit birds beaks and other formations which not only cause undesirable encroachments into device areas but also adversely affect surface planarity.

Trench isolation is another way of providing inter-device isolation. Trench isolation is applicable to both bipolar and field effect transistor technologies. Trenches generally consume less space than field oxides. Traditionally, trench isolation involves etching a narrow, deep trench or groove in a silicon substrate and then filling the trench with a filler material such as a silicon oxide or polysilicon. Trenches are also often used in memory design to provide information storage capacity which requires good electrical connection to selected transistors. However, isolation trenches described here are designed to have minimal charge storage and no electrical connection to any transistor.

As already mentioned, trenches are often filled with "hard" materials such as silicon oxide or polysilicon. However, existing techniques do not permit wide variations in the dimensions of the trench. For example, if a wafer contains both large and small trenches and polysilicon is deposited so that it fills the small trenches, the large trenches will not be completely filled. Furthermore, since polysilicon deposition is not always completely conformal, voids, or at least seams, may form in the polysilicon, especially in narrow trenches. The voids may trap various impurities which may later cause reliability problems.

Another problem with the use of "hard" materials is that they may cause dislocations and other defects in the silicon substrate during subsequent high temperature processing of the wafer due to the differences in rates of thermal expansion between the "hard" filler material and the silicon substrate. Furthermore, trenches formed by traditional techniques have upper surface which are difficult to planarize. Consequently, most designers who employ trenches use them in narrow inter-device regions and use conventional thermally grown field oxides in wider inter-device regions.

Those concerned with the development of advanced semiconductor integrated circuit technology have engaged in a continuous search for improved methods of inter-device isolation and particularly for improved methods of inter-device trench formation of various sizes.

One approach to trench construction is illustrated in Becker et al., "Low Pressure Deposition of Doped SiO$_2$ by Pyrolysis of Tetraethylorthosilicate (TEOS)", J. Electrochem. Soc., Vol. 134, No. 11, pp. 2923-2931 (1987). The publication discusses trenches which contain silicon dioxide spacers and a silicon dioxide block in the center of the trench. The silicon dioxide block effectively reduces the size of the trench cavity; thus making a wide trench into two or more narrow trenches which may, of course, be more easily filled.

SUMMARY OF THE INVENTION

Applicants have invented a method for fabricating trenches in a wide range of sizes that avoids a variety of problems associated with prior art techniques, such as thermally generated stresses in the substrate and voids in the trench filler material. In a typical embodiment of this invention, a trench is etched into a substrate, typically silicon, around the device area which is to be isolated. The interior of the trench is then covered with a primary diffusion barrier; for example, a thermally grown oxide. The primary diffusion barrier serves to prevent diffusion of dopants contained in materials which may subsequently be used to fill the trench. Next, a thermal stress-relief layer (i.e., one that absorbs stresses due to heating efforts), for example, a conformal dielectric, is deposited in the trench over the primary diffusion barrier. The thermal stress-relief layer also serves as a secondary diffusion barrier. Next a third layer of filler material, such as a flowable dielectric is deposited within the trench on top of the thermal stress-relief layer. The filler material has a flow temperature which is lower than the flow temperature of the stress-relief layer. The filler material is deposited with sufficient thickness to completely fill the remainder of the trench and cover the upper surface of the silicon wafer. Then the filler material is flowed by heating it to its flow temperature. During the heating process, the stress-relief layer softens without flowing. The relatively soft stress-relief layer absorbs the stresses generated during the heating process and prevents cracking or dislocations in the diffusion barrier or silicon substrate. Meanwhile, the resulting surface topography of the filler material becomes comparatively flat after flow. Finally, an etch-back planarization step is used to etch the flowed filler material back to the surface of the substrate. After the trench is filled, device processing steps may be started.

DETAILED DESCRIPTION

FIGS. 1-9 have not been drawn to scale so that they may be more clearly understood. Furthermore, the details of individual transistor structures have been eliminated to make the figures clearer. Only cross-sections of trenches are shown. The figures schematically show both a narrow trench and a wide trench. Alternatively, the pair of illustrated structures may be considered cross-sectional views of different points through the same trench.

Figure 1:
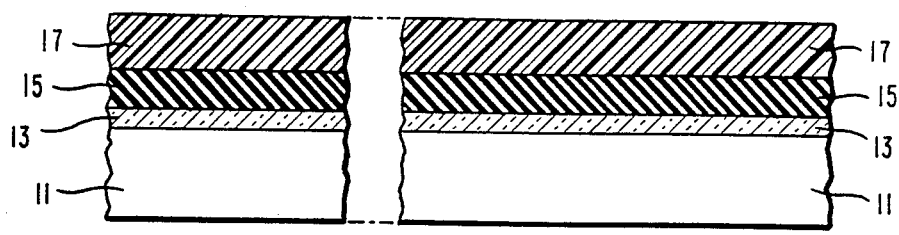
FIGS. 1-8 are cross sectional views of structures of one illustrative embodiment formed by an exemplary sequence of processing steps.

In FIG. 1, reference numeral 11 denotes a substrate, which may be typically silicon. Substrate 11 may include an upper epitaxial layer, if desired. Reference numeral 13 denotes a grown or deposited dielectric pad which may be typically silicon dioxide. Reference numeral 15 denotes a masking layer which may be typically silicon nitride. Reference numeral 17 refers to a patterned material such as a photoresist. Those skilled in the art will realize that pad 13 and masking layer 15 may be formed by conventional techniques during typical initial stages of semiconductor processing. Representative thicknesses for layers 15 and 13 are 1000–3000 Å and 100–400 Å, respectively.

Alternatively, if desired, masking layer 15 may be polysilicon with a thickness of 1000–4000 Å. Polysilicon may be desired as the masking layer instead of silicon nitride because an etchback planarization step (to be described later) typically has greater selectivity for polysilicon than silicon nitride. Other materials may also be used.

Photoresist 17 may be patterned by conventional techniques. Then, the entire structure is etched by techniques well-known to those skilled in the art to "dig" trenches 51 and 53 (illustrated in FIG. 2). (If cover layer 15 is a nitride layer, photoresist 17 may be stripped if desired, before trenches 51 and 53 are created. Nitride layer 15 can then serve as an etch mask. However, if cover layer 15 is polysilicon, photoresist 17 typically remains in place during creation of trenches 51 and 53 because polysilicon does not serve as an effective mask for the common etchants used in etching the underlying silicon substrate.)

One recipe for "digging" a suitable trench is a two-step reactive ion etching process practiced by those skilled in the art. The first step utilizes 150 sccm $O_2$, together with 15 sccm $SF_6$ at 500 Watts power and 400 milliTorr for 1–7 minutes. The second step utilizes 2.5 sccm Freon-13B1 at 500 Watts and 600 milliTorr until a satisfactory trench depth and profile is achieved. Typical trench depths are 1–5 $\mu$m. Numerous other etching recipes will occur to those skilled in the art.

Figure 2:
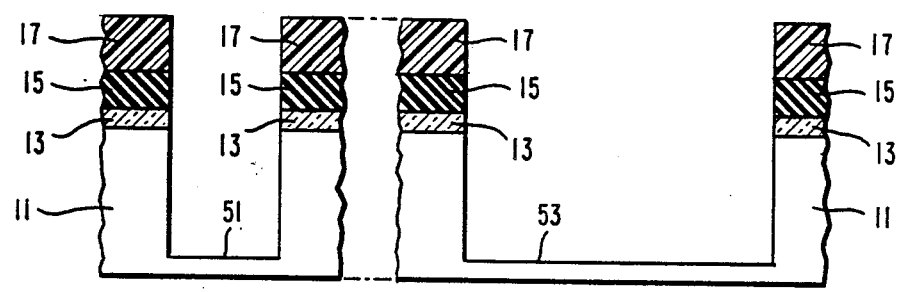

Trench 51 has been illustrated in FIG. 2 as being narrower than trench 53. The invention described herein is applicable to trenches with a wide variety of widths. Trenches as narrow as 0.6 $\mu$m and as wide as 30 $\mu$m have been created with the present technique.

After trenches 51 and 53 have been created, as illustrated in FIG. 2, photoresist 17 is stripped if it has remained in place (e.g., if masking layer 15 is polysilicon). Next, a primary diffusion barrier layer 21 is formed on the sidewalls and bottom of trenches 51 and 53. The diffusion barrier 21 should be a material which exhibits relatively few interface charge traps with substrate 11. Interface charge traps are undesirable because trapped charges attract opposing charges in the substrate, thus creating a channel on the trench wall which, in combination with adjacent source/drain regions, will comprise a parasitic transistor.

Figure 3:
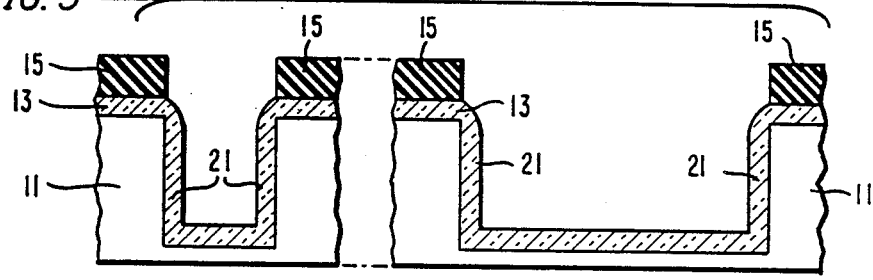

An exemplary candidate for layer 21 is a thin, high-quality undoped silicon dioxide layer. FIG. 3 illustrates oxide layer 21. A steam-grown thermal oxide formed at approximately 850° C. is a good candidate for oxide layer 21 because of its low stress and low silicon-interface trap density. A representative thickness for layer 21 is 100–400 Å. A uniform thickness for layer 21 is desirable and achievable by the above process.

Figure 4:
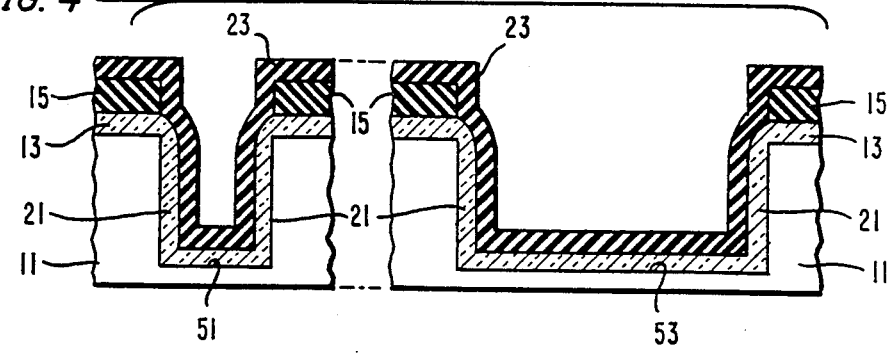

Next, as illustrated in FIG. 4, a thermal stress-relief layer 23 is formed upon diffusion barrier layer 21. As can be seen from FIG. 4, stress-relief layer 23 completely covers oxide layer 21 on the bottom and sidewalls of trenches 51 and 53. A comparatively uniform thickness for layer 23 is desirable. A representative thickness for layer 23 is 1000–3000 Å.

Stress relief layer 23 may be, for example, borophosphosilicate glass (BPSG) or an oxide layer deposited by the pyrolysis and decomposition of tetraethoxysilane [$(Si(OC_2H_5)_4)$], abbreviated TEOS. Methods for depositing BPSG or pyrolyzing TEOS are well-known to those skilled in the art. Consequently, the expression "depositing a layer of TEOS" is generally understood by those skilled in the art to mean the deposition of a dielectric layer by decomposition and pyrolysis of TEOS in a reactor. The resulting oxide of silicon exhibits excellent step coverage. Other oxide precursor gases, for example, silane, may be employed, if desired. However, TEOS is comparatively safer to handle than, for example, silane.

Other materials may also be used for layer 23. Whatever material is utilized for layer 23, it should have a low charge trap density and a comparatively high flow temperature. The significance of the comparatively high flow temperature layer 23 will be subsequently explained.

Figure 5:
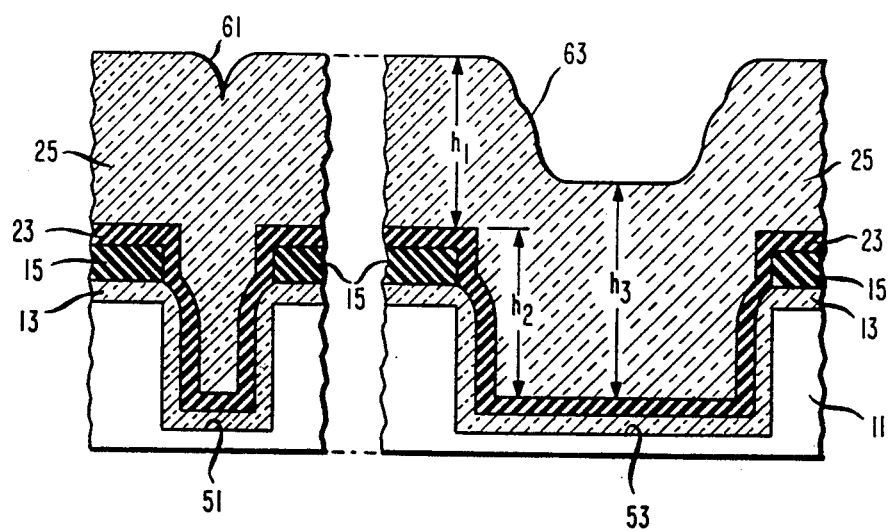

After layer 23 is deposited, a filler layer 25, illustrated in FIG. 5, is deposited. The filler layer 25 is a material which flows at a lower temperature than stress-relief 23. Furthermore, filler layer 25 is deposited in sufficient quantity to fill the trench.

An exemplary candidate for filler layer 25 is an oxide formed by the pyrolysis and decomposition of TEOS with approximately 3 percent boron and 3 percent phosphorous by weight added. The resulting dielectric material is often assigned the acronym, BPTEOS, associated with the chemical precursors used in its deposition. Thus, the expression "depositing a layer of BTPEOS" is generally understood by those skilled in the art to mean the deposition of a dielectric layer by decomposition of TEOS in the presence of phosphorous and boron dopants in a reactor. The phosphorous and boron dopants may be obtained, for example, from trimethylphosphite, phospine, trimethylborate, trimethylphosphate, triethylphosphite, or triethylphosphate.

A variety of other materials may be selected to produce layers 23 and 25. For layer 23, the chemical precursors, diacetoxytditertiarybutoxysilane ($C_{10}H_{26}O_4Si$), known by the acronym "DADBS", or tetramethylcyclotetrasiloxane ($C_4H_{16}Si_4O_4$), known by the acronym "TMCTS", sold by J. C. Schumacher, a unit of Air Products and Chemicals Inc. under the trademark "TOMCATS", may be used. Deposition techniques for these materials are known to those skilled in the art.

For layer 25, any of the above chemical precursors may be combined with dopants to provide a suitable flowable filler material. Furthermore, layer 23 may be also formed from any of the above precursors, together with dopants, provided the doping level in layer 23 is lower than in layer 25 so tht layer 25 will have a lower flow temperature than layer 23.

For example, the flow properties of dielectrics deposited from BPTEOS are substantially influenced by the percentages of included boron and phosphorous. Consequently, one might use BPTEOS to form thermal stress relief layer 23 if layer 23 includes lesser amounts of dopants from filler material 25 so that the flow temperature of layer 25 remains below the flow temperature of layer 23. Alternatively, a thermal stress-relief layer 23 formed from TEOS with a small amount of phosphorous and no significant amount of boron (known by the acronym PTEOS) may be used, provided the phosphorous content is adjusted so that the flow temperature of layer 25 remains below the flow temperature of layer 23. It should also be noted that the flow temperature of filler material 25 should desirably be higher than the temperatures of all subsequent furnace heat treatments to which the wafer is subjected.

Figure 6:
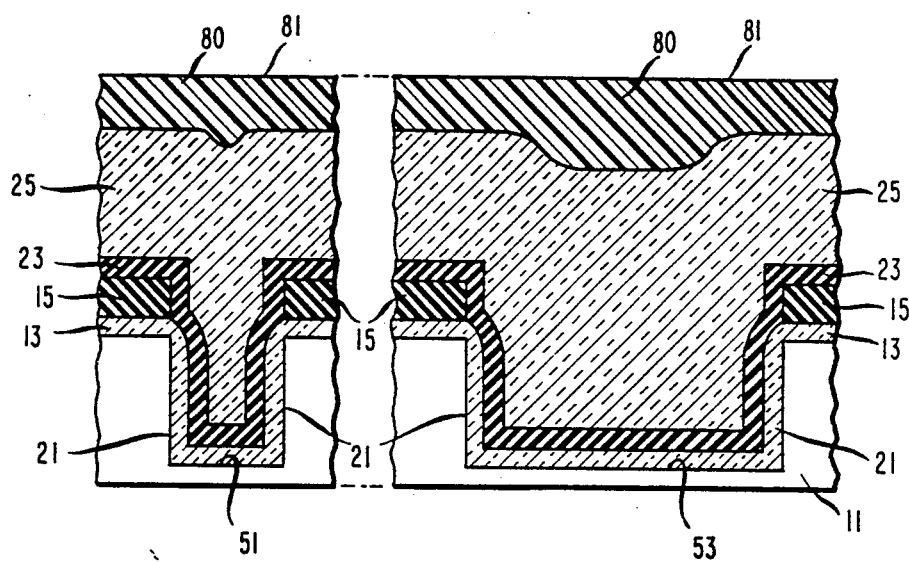

After filler material 25 has been deposited, it is flowed by heating it, either in a furnace or by a rapid thermal anneal (RTA) process. The resulting structure after flow is illustrated in FIG. 6. If BPTEOS is used for layer 25, with the specified amounts of boron and phosphorous, it may be flowed at a temperature of between 850° C. and 950° C. for ½ to 2 hours in an atmosphere of either nitrogen or oxygen. Alternatively, the BPTEOS may be rapidly thermal annealed (RTA) at 1000° C. for 30-60 sec.

The structure of FIG. 6 is next subjected to an etchback planarization technique to planarize the surface of the wafer. Various etchback planarization techniques are well-known to those skilled in the art. Typically, a photoresist 81 is deposited on top of layer 25. The photoresist 81 is spun to create a planar upper surface. Then the combination photoresist and layer 25 is etched with an etchant that attacks both materials at the same rate. U.S. Pat. No. 4,481,070 issued to Thomas et al. illustrates an etchback planarization technique.

If trench 51 is very narrow (i.e., has a high aspect ratio), voids may be formed in layer 25 after it is deposited. To prevent voids, a repeated flow and etchback procedure can be performed. The repeated flow and etchback procedure can be accomplished by those skilled in the art in separate reactors, or in a single reactor. During the repeated flow and etchback procedure, a photoresist material is applied to the surface of layer 25 and planarized, for example, by spinning. Then, the combination photoresist and layer 25 are etched downward for some distance. Layer 25 is then heated to its flow temperature. Then, another photoresist is applied and the entire process repeated one or more times.

Referring to FIG. 5, the height of trench 53 is denoted by $h_2$. The thickness of layer 25 within trench 53 is denoted by $h_3$. It is desirable that $h_3$ be greater than $h_2$ so that the trench will be completely filled before flow and etchback begins. The thickness, $h_1$ of layer 25 above the upper surface of the wafer is, typically, equal to $h_3$. Dimples, or hollows, 61 and 63, may be noted in the upper surface of layer 25 above trenches 51 and 53, respectively. Because trench 53 is wider than trench 51, dimple 63 is wider than dimple 61, due to the fairly conformal properties of layer 25. Of course, no matter how wide the trench, it will be virtually completely filled if the thickness of deposited layer 25 is chosen to be equal to or greater than the depth of the trench.

Figure 7:
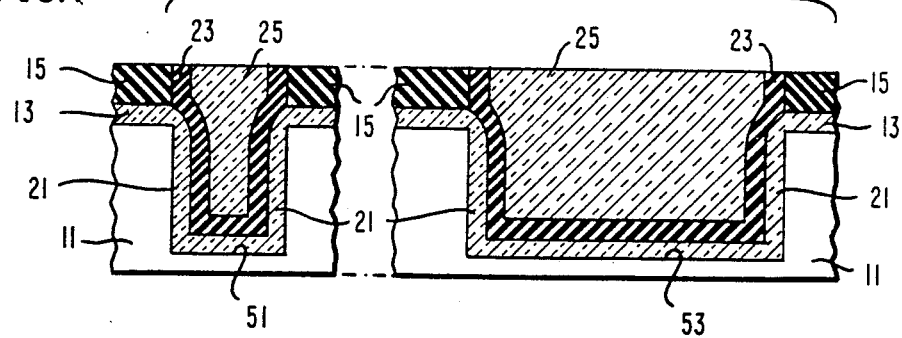

FIG. 7 illustrates the wafer after photoresist 81 and layer 25 have been etched back until the upper surface of layer 15 (typically silicon nitride or polysilicon) has been reached. Comparisons of FIGS. 6 and 7 shows that the upper portion of layer 23 has also been removed. The upper portion of layer 23 may be removed by the same etchback procedure if layer 23 is, for example TEOS or BPTEOS and layer 25 is formed from BPTEOS. Should layer 23 be a material which is not easily etched by the procedure which etches layer 25 and photoresist 81, it may be stripped by a separate procedure using a different etchant.

Figure 8:
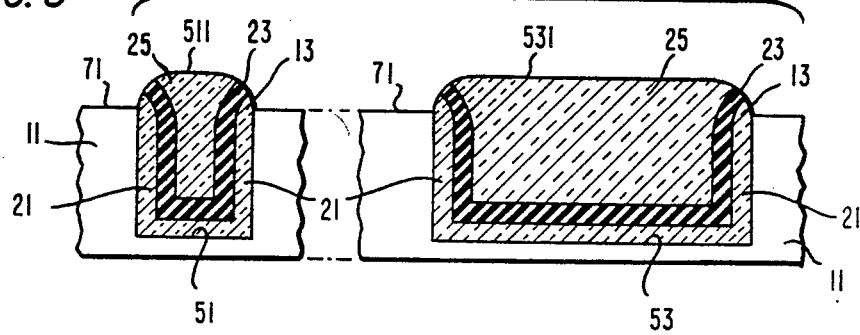

When the configuration depicted in FIG. 7 is reached, layers 15, 13 and a small portion of layer 23 which is adjacent those layers may be stripped away to produce the configuration shown in FIG. 8. FIG. 8 illustrates the wafer with trenches 51 and 53 filled and upper surface 71 of silicon ready for further processing, such as device formation, according to procedures known in the semiconductor art.

FIG. 8 shows that the upper surfaces 531 and 511 of trenches 51 and 53 protrude somewhat beyond upper surface 71 of the silicon wafer. The protrusions 531 and 511, which are typically a few hundred Angstroms, are advantageous because they help prevent parasitic channel formation around the sidewalls of the trench, which may occur with trenches formed by conventional processes. A parasitic channel may be formed when the gate runner contacts exposed oxide on the trench sidewall. If the exposed oxide is thinner than the gate oxide of an adjacent MOS transistor, the parasitic channel causes increased transistor leakage current. (A discussion and diagram of parasitic channel formation is contained in Kurosawa et al., "A New Birds'-Beak Free Field Isolation Technology for VLSI Devices", IEEE IEDM Technical Digest, pp. 384-387, 1981.)

The presence of protrusions 531 and 511 is ensured by layer 15. Layer 15 serves as an etch-stop for the planarization etch-back process and helps to govern the height of protrusions 531 and 511.

As mentioned before, the technique just described works nicely to fill trenches of various sizes on the same wafer. Returning to FIG. 5, it will be noted, as mentioned before, that narrow trench 51 has a relatively narrow dimple, 61, in layer 25. By contrast, wide trench 53 has a much wider dimple, 63 in layer 25. However, the planarization step illustrated by FIG. 6, permits adequate filling of wide trench 53, as well as narrow trench 51.

Another advantage of the present invention is that relatively few crystalline defects are generated in silicon substrate 11 during the fill-in sequence illustrated in FIGS. 3-6. Thermal stress-relief layer 23 softens during the deposition and subsequent heating of filler material 25. The soft layer 23 absorbs the thermal stresses generated during the deposition and subsequent heating of layer 25, thus preventing, or at least reducing, the occurrence of defects and dislocations in layer 21 or substrate 11. Furhermore, subsequent heat treatments performed after the creation and filling of trenches 51 and 53 are not likely to induce cracks, defects, or dislocations in substrate 11. During subsequent heat treatments, both dielectrics 25 and 23 soften and absorb thermally generated stresses.

Layer 21 (and, to a lesser extent, layer 23) serves as diffusion barriers. They prevent dopants which may be used in filler material 25 from diffusing into the substrate.

The above-described technique exhibits a variety of advantages over prior art techniques. One already-mentioned prior art technique creates a silicon dioxide block within the trench itself. The block effectively partitions a large trench into two or more smaller trenches. However, creation of the block requires an additional mask. Applicants' invention avoids the use of such an additional mask. An additional advantage of applicants' invention is the prevention of parasitic transistor formation. Convex protrusions 511 and 531 are instrumental in preventing parasitic transistor-formation. The presence of protrusions 511 and 531 is ensured by mask layer 15 (which is subsequently etched away). By contrast, some prior art trench designs have concave upper surfaces which, under various circumstances, may increase the liklihood of parasitic transistor formation. For example, the structure shown in FIG. 15 of the Becker et al. article (as noted above) has a concave upper surface. The sides of the trench have spacers which are formed by depositing and then etching TEOS. However, in a manufacturing environment, the spacers cannot be consistently made with an upper surface which is smooth with the top of the silicon substrate. Some overetching will inevitably occur on some spacers. Consequently, the trench will have a region of exposed silicon on its sidewall (above the slightly overetched spacer). Subsequent normal device processing steps may create a parasitic device at the upper exposed portion of the trench wall.

A few other advantages of the inventive design are also worthy of mention. Prior art trenches filled with polysilicon may exhibit voids or seams which may trap various impurities. The impurities may later escape and cause device reliability problems. Applicants' invention may be practiced, as mentioned before, with a repeated flow and etchback procedure which is very helpful in eliminating voids in the filler material. Furthermore, polysilicon is not an ideal insulator, having a resistivity of roughly $10^6 \Omega$-cm. The oxides employed in applicants' trench have resistivities approximately eight orders of magnitude greater—thus, providing better isolation.

Figure 9:
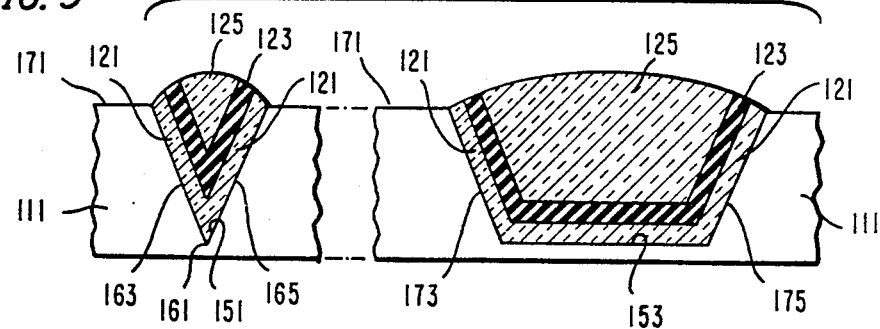
FIG. 9 is a cross sectional view of an additional illustrative embodiment of the present invention.

The present invention is not limited to trenches with straight sidewalls. FIG. 9 illustrates two trenches 151 and 153 with slanted sidewalls. Trench 151 is "V" shaped with slanted walls 163 and 165 and bottom 161. Trench 153 has a flat bottom and slanted sidewalls 173 and 175. Various methods for making trenches with slanted sidewalls are known to those skilled in the art. These methods include wet chemical etches utilizing KOH or plasma taper etches.

Both trenches are filled and processed in the manner previously described. The resulting structures shown in FIG. 9 contain layers 121, 123, and 125 which are akin to layers 21, 23, and 25 of FIG. 8.

Other embodiments of the inventive principles disclosed herein are also contemplated, including use with Groups III–V substrates, such as gallium arsenide.

We claim:

1. A method of semiconductor device fabrication comprising:
   forming a trench into a substrate;
   forming a diffusion barrier layer in said trench;
   characterized by the further steps of
   depositing a thermal stress-relief layer upon said barrier layer;
   depositing a filler material upon said thermal stress relief layer, said filler material having an outer surface and filling said trench, said filler material having a flow temperature which is lower than the flow temperature of said thermal stress relief layer;
   heating said filler material to at least its flow temperature to smooth said outer surface; and etching back said upper surface of filler material.

2. The method of claim 1 wherein said substrate is silicon.

3. The method of claim 1 wherein said thermal stress relief layer is formed by deposition of a material chosen from the group consisting of tetraethoxysilane, diacetoxyditertiarybutoxysilane, and tetramethylcyclotetrasiloxane.

4. The method of claim 1 wherein said thermal stress relief layer is borophosphosilicate glass.

5. The method of claim 1 wherein said filler material is formed by deposition of a material chosen from the group consisting of: tetraethoxysilane, diacetoxyditertiarybutoxysilane, and tetramethylcyclotetrasiloxane, together with dopants to promote flowability.

6. The method of claim 1 wherein said diffusion barrier is silicon dioxide.

7. The method of claim 1 wherein said filler material contains $3 \pm \frac{1}{2}$ percent each boron and phosphorous by weight.

8. The method of claim 1 wherein said etching-back step includes the steps of:
   depositing a resist material upon said outer surface of said filler material;
   planarizing said resist; and,
   etching said resist and said filler material to expose the outer surface of said filler material.

9. The method of claim 1, wherein said heating step and said etching-back step are performed more than once.

10. The method of claim 1, wherein said heating step is performed in a furnace at 950° C.±50° C.

11. The method of claim 1 wherein said heating step is accomplished by rapid thermal annealing at 1050±50° C.

12. The method of claim 1 wherein said filler material contains dopants and wherein said thermal stress relief layer contains dopants in a lesser concentration than said filler material.

13. A method for semiconductor device manufacture comprising:
   depositing a first silicon dioxide layer upon a surface of a silicon substrate;
   depositing a layer of silicon nitride upon said first layer of silicon dioxide;
   selectively etching through said silicon dioxide layer and said silicon nitride layer into said silicon substrate to form at least one trench, said trench having sidewalls and a bottom, a portion of said first silicon dioxide layer, and said silicon nitride layer remaining on said silicon surface;
   forming a second silicon dioxide layer on said sidewalls and said bottom of said trench;
   depositing a thermal stress relief layer upon said second silicon dioxide layer, said thermal stress relief layer being formed by the decomposition of an oxide precursor gas, said thermal stress relief layer defining a cavity within said trench;
   depositing a flowable filler material into said cavity, said filler material being produced by the decomposition of an oxide percursor gas, together with boron and phosphorous, said filler material being thick enough to substantially fill said cavity and to have a thickness above said surface of said silicon substrate, said flowable filler material having a flow temperature lower than the flow temperature of said thermal stress relief layer;
   heating said flowable filler material to cause said filler material to flow;
   etching back said filler material, together with said portion of said first silicon dioxide layer remaining on said silicon surface and together with the said portion of said silicon nitride layer remaining on said silicon surface to expose said silicon surface and to create an upper surface on said filler material which protrudes slightly above said silicon surface.

* * * * *